US008344339B2

(12) United States Patent  
Levesque et al.

(10) Patent No.: US 8,344,339 B2  
(45) Date of Patent: Jan. 1, 2013

(54) SOURCE-COLLECTOR MODULE WITH GIC MIRROR AND TIN ROD EUV LPP TARGET SYSTEM

(75) Inventors: Richard A. Levesque, Livermore, CA (US); Natale M. Ceglio, Pleasanton, CA (US); Giovanni Nocerino, Pleasanton, CA (US); Fabio Zocchi, Samarate (IT)

(73) Assignee: Media Lario S.R.L., Bosisio Parini (IT)

( * ) Notice: Subject to any disclaimer, the term of this patent is extended or adjusted under 35 U.S.C. 154(b) by 226 days.

(21) Appl. No.: 12/807,166

(22) Filed: Aug. 30, 2010

(65) Prior Publication Data

US 2012/0050708 A1 Mar. 1, 2012

(51) Int. Cl.
*H01J 37/20* (2006.01)

(52) U.S. Cl. .................................................. 250/504 R
(58) Field of Classification Search ............... 250/504 R
See application file for complete search history.

(56) References Cited

U.S. PATENT DOCUMENTS 8,288,743 B2 * 10/2012 Ueno et al. ................ 250/504 R
2011/0133621 A1 * 6/2011 Zhokhavets et al. ............ 313/46

* cited by examiner

*Primary Examiner* — Jack Berman
*Assistant Examiner* — Eliza Osenbaugh-Stewart
(74) *Attorney, Agent, or Firm* — Opticus IP Law PLLC

(57) ABSTRACT

A source-collector module (SOCOMO) for generating a laser-produced plasma (LPP) that emits EUV radiation, and a grazing-incidence collector (GIC) mirror arranged relative to the LPP and having an input end and an output end. The LPP is formed using an LPP target system having a light source portion and a target portion, wherein a pulsed laser beam from the light source portion irradiates a rotating Sn rod in the target portion to generate the EUV radiation. The GIC mirror is arranged relative to the LPP to receive the EUV radiation at its input end and focus the received EUV radiation at an intermediate focus adjacent the output end. A radiation collection enhancement device having at least one funnel element may be used to increase the amount of EUV radiation provided to the intermediate focus and/or directed to a downstream illuminator. An EUV lithography system that utilizes the SOCOMO is also disclosed.

11 Claims, 12 Drawing Sheets

SOURCE-COLLECTOR MODULE WITH GIC MIRROR AND TIN ROD EUV LPP TARGET SYSTEM

FIELD

The present disclosure relates generally to grazing-incidence collectors (GICs), and in particular to a source-collector module for use in an extreme ultraviolet (EUV) lithography system that employs a laser-produced plasma (LPP) target system that uses a tin rod to generate EUV radiation.

BACKGROUND ART

Laser-produced plasmas (LPPs) are formed in one example by irradiating Sn droplets with a focused laser beam. Because such LPPs can radiate in the extreme ultraviolet (EUV) range of the electromagnetic spectrum, they are considered to be a promising EUV radiation source for EUV lithography systems.

FIG. 1 is a schematic diagram of a generalized configuration for a prior art LPP-based source-collector module ("LPP-NIC SOCOMO") 10 that uses a normal-incidence collector ("NIC") mirror MN, while FIG. 2 is a more specific example configuration of the "LPP-NIC" SOCOMO 10 of FIG. 1. The LPP-NIC SOCOMO 10 includes a high-power laser 12 that generates a high-power, high-repetition-rate laser beam 13 having a focus F13. LPP-NIC SOCOMO 10 also includes along an axis A1 a fold mirror FM and a large (e.g., ~600 mm diameter) ellipsoidal NIC mirror MN that includes a surface 16 with a multilayer coating 18. The multilayer coating 18 is essential to guarantee good reflectivity at EUV wavelengths. LPP-NIC SOCOMO 10 also includes a Sn source 20 that emits a stream of tin (Sn) pellets 22 that pass through laser beam focus F13.

In the operation of LPP-NIC SOCOMO 10, laser beam 13 irradiates Sn pellets 22 as the Sn pellets 22 pass through the laser beam focus F13, thereby produce a high-power LPP 24. LPP 24 typically resides on the order of hundreds of millimeters from NIC mirror MN and emits EUV radiation 30 as well as energetic Sn ions, particles, neutral atoms, and infrared (IR) radiation. The portion of the EUV radiation 30 directed toward NIC mirror MN is collected by the NIC mirror MN and is directed (focused) to an intermediate focus IF to form an focal spot FS. The intermediate focus IF is arranged at or proximate to an aperture stop AS. Only that portion of the EUV radiation 30 that makes it through aperture stop AS forms focal spot FS. Here it is noted that focal (focus) spot FS is not an infinitely small spot located exactly at intermediate focus IF, but rather is a distribution of EUV radiation 30 generally centered at the intermediate focus IF.

Advantages of LPP-NIC SOCOMO 10 are that the optical design is simple (i.e., it uses a single ellipsoidal NIC mirror) and the nominal collection efficiency can be high because NIC mirror MN can be designed to collect a large angular fraction of the EUV radiation 30 emitted from LPP 24. It is noteworthy that the use of the single-bounce reflective NIC mirror MN placed on the opposite side of LPP 24 from the intermediate focus IF, while geometrically convenient, requires that the Sn source 20 not significantly obstruct EUV radiation 30 being delivered from the NIC mirror MN to the intermediate focus IF. Thus, there is generally no obscuration in the LPP-NIC SOCOMO 10 except perhaps for the hardware needed to generate the stream of Sn pellet 22.

LPP-NIC SOCOMO 10 works well in laboratory and experimental arrangements where the lifetime and replacement cost of LPP-NIC SOCOMO 10 are not major considerations. However, a commercially viable EUV lithography system requires a SOCOMO that has a long lifetime. Unfortunately, the proximity of the surface 16 of NIC mirror MN and the multilayer coatings 18 thereon to LPP 24, combined with the substantially normally incident nature of the radiation collection process, makes it highly unlikely that the multilayer coating 18 will remain undamaged for any reasonable length of time under typical EUV-based semiconductor manufacturing conditions.

A further drawback of the LPP-NIC SOCOMO 10 is that it cannot be used in conjunction with a debris mitigation tool based on a plurality of radial lamellas through which a gas is flowed to effectively stop ions and neutrals atoms emitted from the LPP 24 from reaching NIC mirror MN. This is because the radial lamellas would also stop the EUV radiation 30 from being reflected from NIC mirror MN.

Multilayer coating 18 is also likely to have its performance significantly reduced by the build-up of Sn, which significantly absorbs the incident and reflected EUV radiation 30, thereby reducing the reflective efficiency of the multilayer coated ellipsoidal mirror. Also, the aforementioned energetic ions, atoms and particles produced by LPP 24 will bombard multilayer coating 18 and destroy the layered order of the top layers of the multilayer coating 18. In addition, the energetic ions, atoms and particles will erode multilayer coating 18, and the attendant thermal heating from the generated IR radiation can act to mix or interdiffuse the separate layers of the multilayer coating 18.

While a variety of fixes have been proposed to mitigate the above-identified problems with LPP-NIC SOCOMO 10, they all add substantial cost and complexity to the LPP-NIC SOCOMO 10, to the point where it becomes increasingly unrealistic to include it in a commercially viable EUV lithography system. Moreover, the Sn droplet LPP EUV light source is a complex and expensive part of the LPP-NIC SOCOMO 10. What is needed therefore is a less expensive, less complex, more robust and generally more commercially viable SOCOMO for use in an EUV lithography system that uses a simpler and more cost-effective LPP-based EUV radiation source.

SUMMARY

The present disclosure is generally directed to grazing incidence collectors (GICs), and in particular to GIC mirrors used to form a source-collector module (SOCOMO) for use in EUV lithography systems, where the SOCOMO includes a LPP target system that uses a tin (Sn) rod and a laser to generate EUV radiation.

An aspect of the disclosure is a SOCOMO for an EUV lithography system. The SOCOMO includes a laser that generates a pulsed laser beam, and a fold mirror arranged along a SOCOMO axis and configured to receive the pulsed laser beam and reflect the pulsed laser beam down the SOCOMO axis in a first direction. The SOCOMO further includes a Sn rod system having a Sn rod with a Sn surface and configured to rotate the Sn surface past an irradiation location, where the Sn surface is irradiated by the pulsed laser beam, thereby creating a LPP that generates EUV radiation in a second direction that is generally opposite the first direction. The SOCOMO also includes a GIC mirror having an input end and an output end and arranged to receive the EUV radiation at the input end and focus the received EUV radiation at an intermediate focus adjacent the output end.

Another aspect of the disclosure is a method of collecting EUV radiation from an LPP. The method includes providing a GIC mirror along an axis, the GIC mirror having input and output ends. The method also includes arranging adjacent the input end of GIC mirror an LPP target system configured to provide a Sn rod with a Sn surface, including moving the Sn surface past an irradiation location. The method further includes sending a pulsed laser beam down the axis of GIC mirror axis and through the GIC mirror from the output end to the input end and to the Sn surface at the irradiation location, thereby forming the LPP that emits the EUV radiation. The method additionally includes collecting with the GIC mirror at the input end of GIC mirror a portion of the EUV radiation from the LPP and directing the collected EUV radiation out of the output end of GIC mirror to form a focal spot at an intermediate focus.

Another aspect of the disclosure is an LPP target system. The LPP target system includes a laser that generates a pulsed laser beam comprising a train of optical pulses. The LPP target system also includes a Sn rod that includes an Sn surface and a central axis, and a support frame that supports the Sn rod in an operable position so that the Sn rod can both rotate and translate about its central axis. The LPP target system also includes a rotational drive unit and a translational drive unit respectively mechanically coupled to the Sn rod to cause the Sn rod to rotate and translate about its central axis so that a new portion of the Sn surface is irradiated by each optical pulse in the pulsed laser beam.

Additional features and advantages of the disclosure are set forth in the detailed description below, and in part will be readily apparent to those skilled in the art from that description or recognized by practicing the disclosure as described herein, including the detailed description which follows, the claims, as well as the appended drawings.

Figure 1:
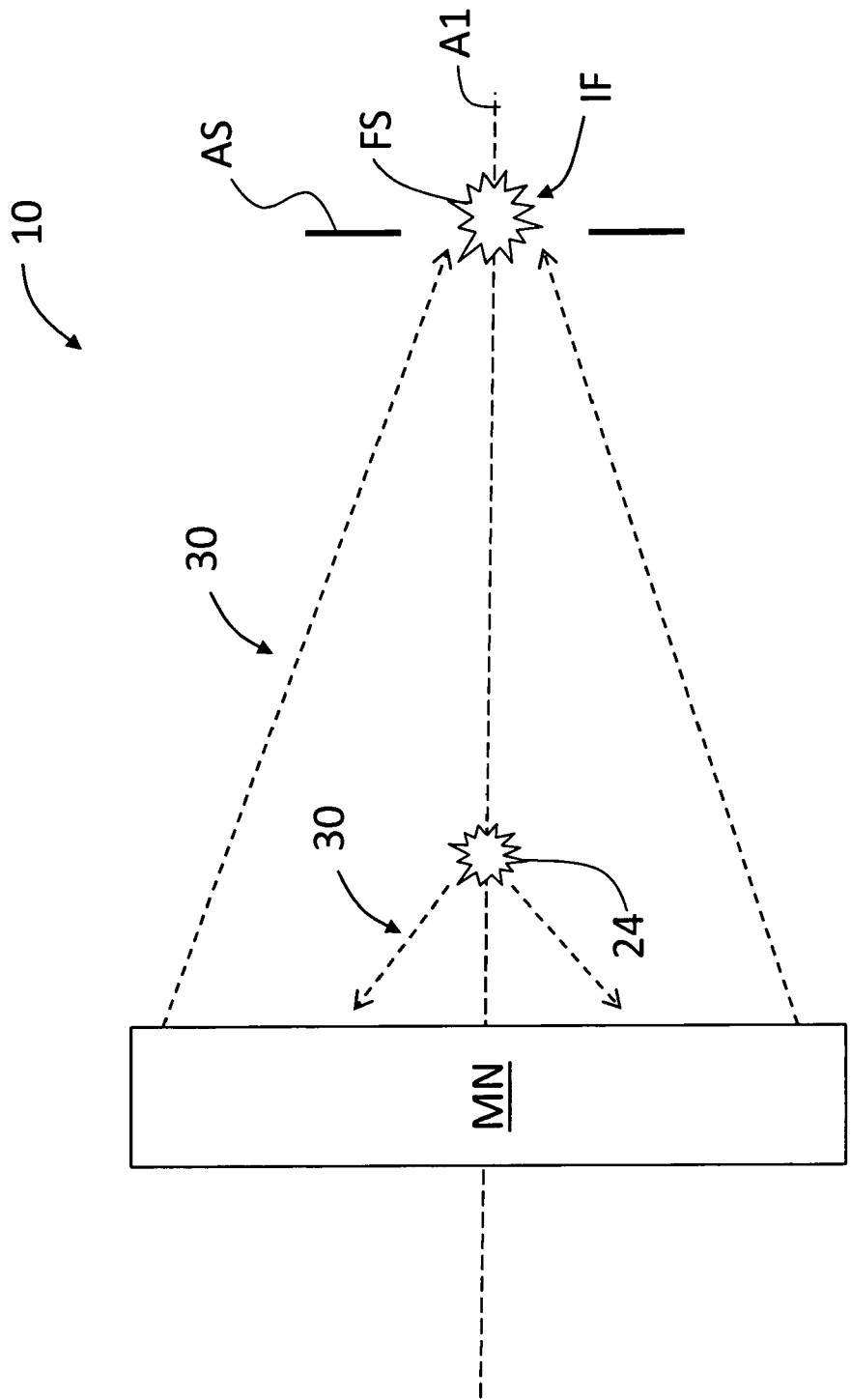
FIG. 1 is a schematic diagram of a generalized example prior art LPP-NIC SOCOMO.
Figure 2:
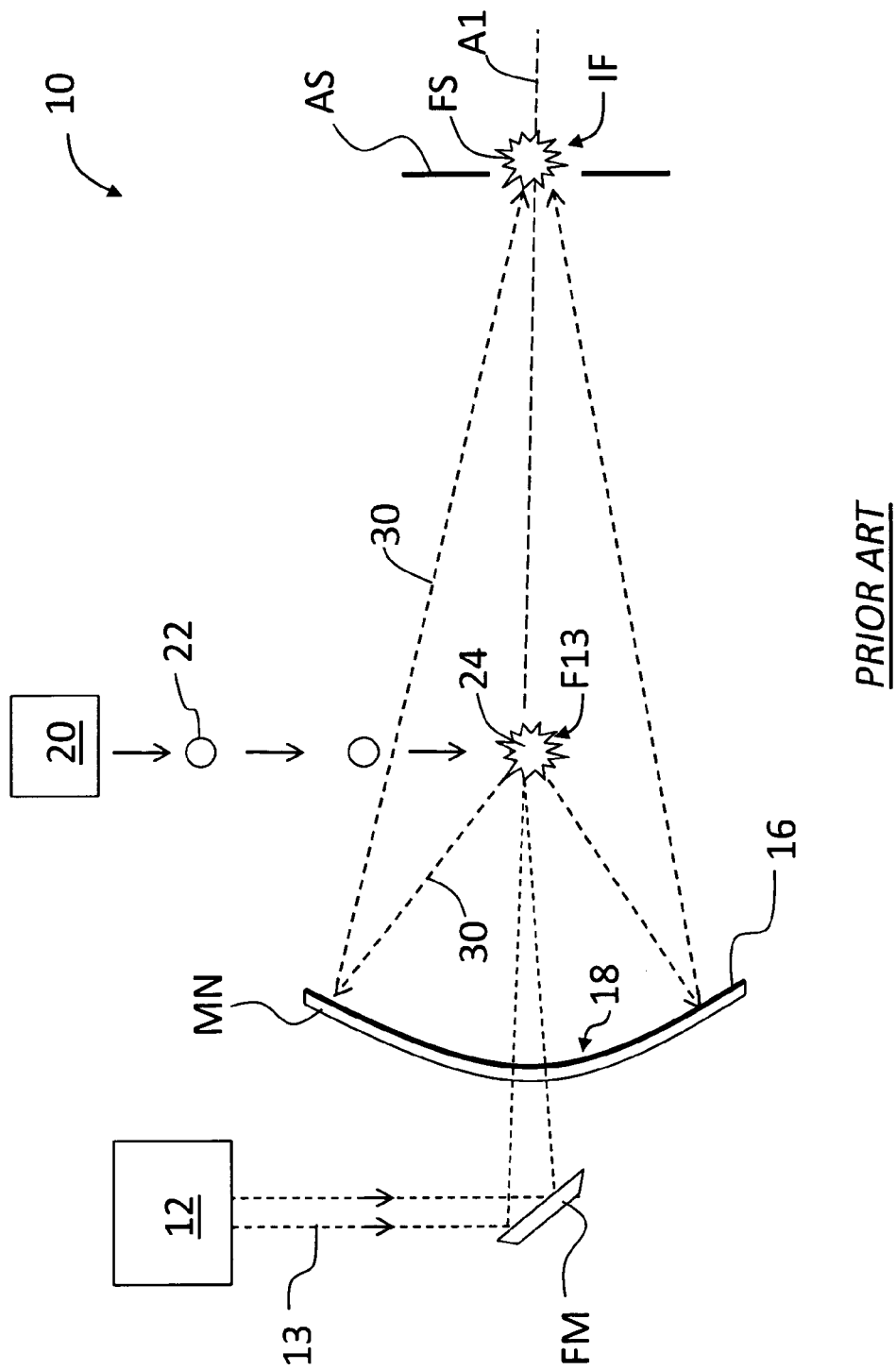
FIG. 2 is a schematic diagram of a particular example of a prior art LPP-NIC SOCOMO in accordance with FIG. 1.

The various elements depicted in the drawing are merely representational and are not necessarily drawn to scale. Certain sections thereof may be exaggerated, while others may be minimized. The drawing is intended to illustrate an example embodiment of the disclosure that can be understood and appropriately carried out by those of ordinary skill in the art.

DETAILED DESCRIPTION

The present disclosure is generally directed to GICs, and in particular to GIC mirrors used to form a source-collector module (SOCOMO) for use in EUV lithography systems that have a LPP-based EUV light source.

Figure 3A:
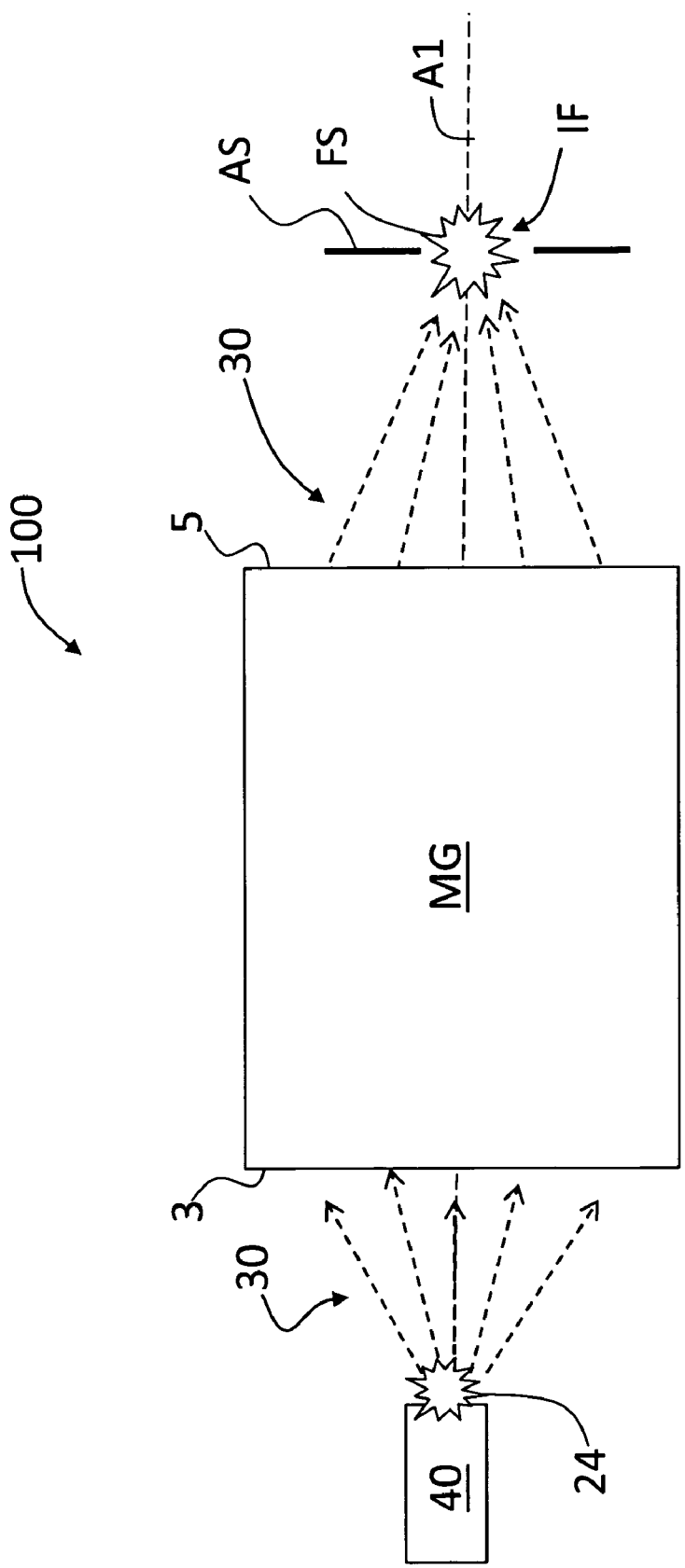
FIG. 3A is a generalized schematic diagram of an example GIC-based SOCOMO for an LPP source ("LPP-GIC SOCOMO"), wherein the LPP and intermediate focus are on opposite sides of the GIC mirror.
Figure 3B:
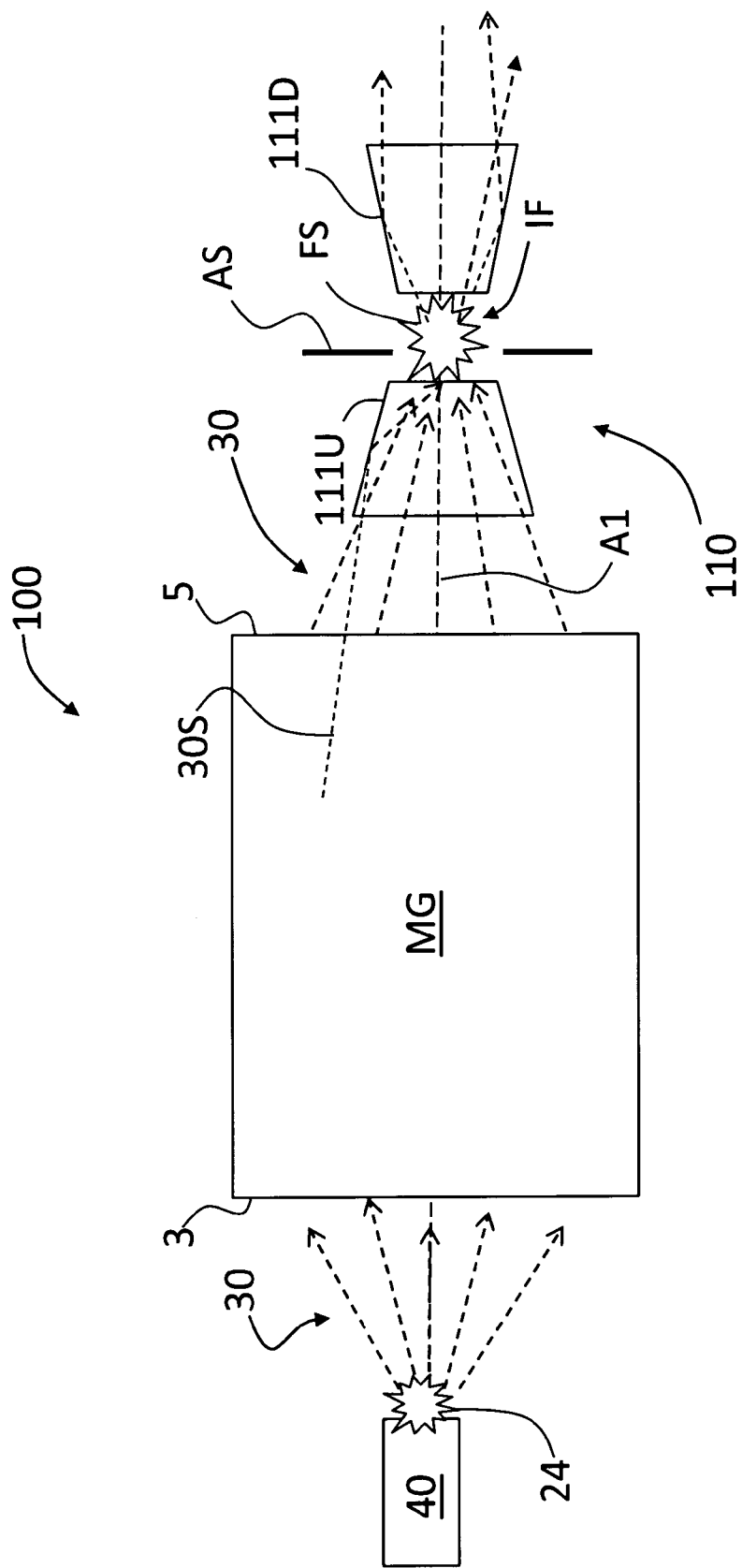
FIG. 3B is similar to FIG. 3A, wherein the LPP-GIC SOCOMO additionally includes an optional radiation collection enhancement device (RCED) arranged between the GIC mirror and the intermediate focus, with the example RCED having upstream and downstream funnel elements on respective sides of the intermediate focus.

FIG. 3A and FIG. 3B are generalized schematic diagrams of example LPP-GIC SOCOMOs 100, wherein LPP 24 and intermediate focus IF are on opposite sides of a GIC mirror MG. GIC mirror MG has an input end 3 and an output end 5. An LPP target system 40 that generates LPP 24 is also shown, and an example of the LPP target system 40 is discussed in detail below. In FIG. 3B, LPP-GIC SOCOMO 100 further includes an optional radiation collection enhancement device (RCED) 110, such as described in U.S. Provisional Patent Application Ser. No. 61/341,806 entitled "EUV collector system with enhanced EUV radiation collection," which application is incorporated by reference herein. RCED 110 is arranged along optical axis A1 immediately adjacent intermediate focus IF and aperture stop AS on the side of GIC mirror MG and is configured to increase the amount of EUV radiation 30 that makes it through the aperture stop AS to the intermediate focus IF to form focal spot FS. This is illustrated by a skew EUV ray 30S that is redirected by RCED 110 through aperture stop AS to form focal (focus) spot FS.

In an example embodiment, RCED 110 includes an inverted funnel-like element (i.e., a downstream funnel element) 111D arranged downstream of intermediate focus IF and configured to direct EUV radiation 30 from intermediate focus IF to a downstream position, such as to the illumination optics (see FIG. 10, introduced and discussed below). Such an embodiment can be effective in making the projected EUV radiation 30 at a downstream illuminator more uniform and thereby better utilized at the reticle plane. RCED 110 may include upstream and downstream funnel elements 111U and 111D, where upstream and downstream here are defined relative to intermediate image IF. RCED 110 may include just the upstream funnel element 111U (see e.g., FIG. 4) or just the downstream funnel element 111D. In another example, RCED 110 is a continuous (monolithic) element that combines the upstream and downstream funnel elements 111U and 111D to form a single funnel element 111 that has upstream and downstream funnel portions rather than separate elements. In the case where a single funnel element 111 is used, it is simply referred to as RCED 110.

Figure 4:
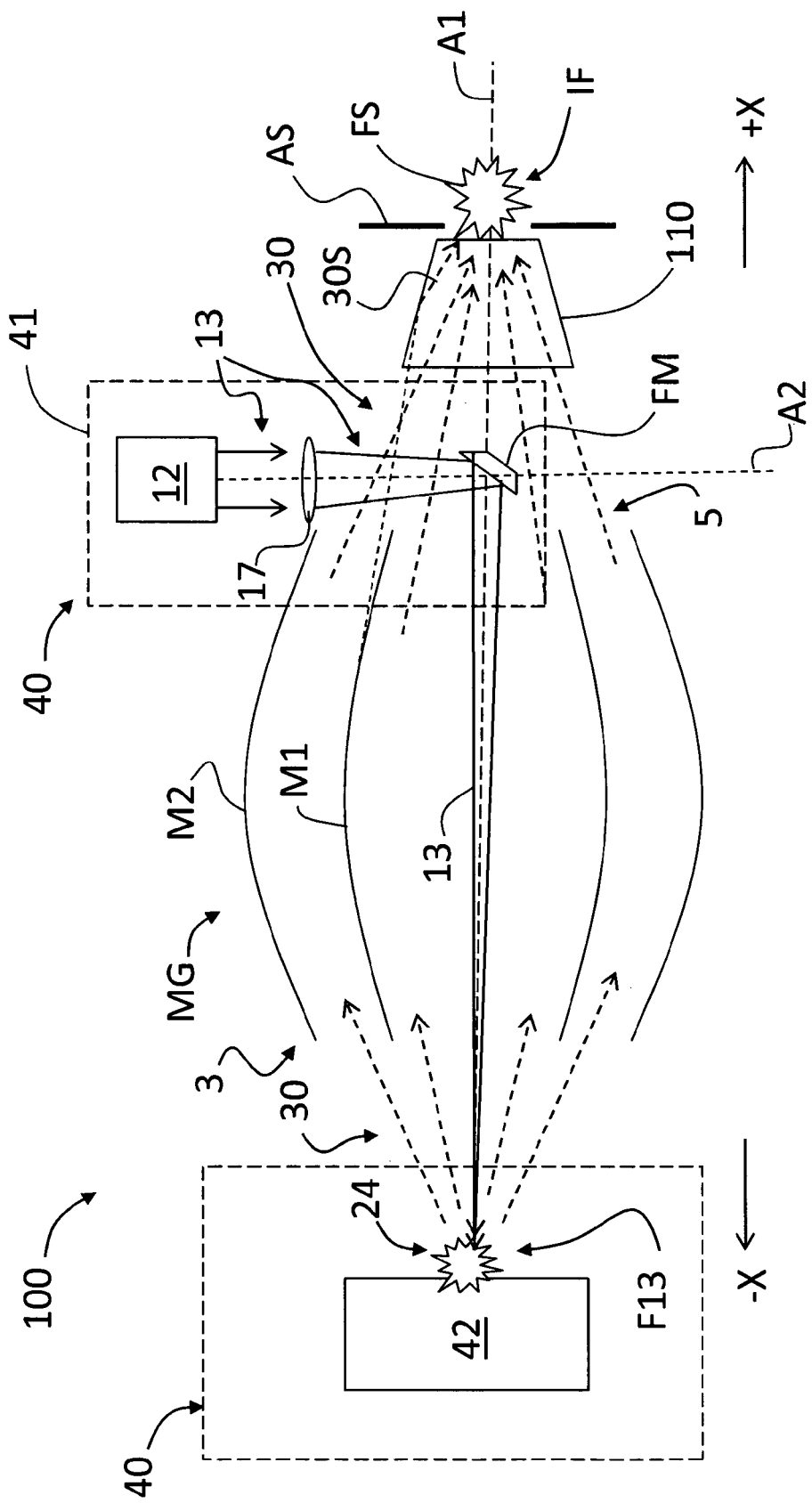
FIG. 4 is a schematic diagram of example LPP-GIC SOCOMO based on the generalized configuration of FIG. 3B, and showing the light source portion and the target portion of the LPP target system.

FIG. 4 is a schematic diagram of an example LPP-GIC SOCOMO 100 based on the general configuration of FIG.

3B. LPP-GIC SOCOMO 100 of FIG. 4 utilizes an LPP target system 40 that includes a light source portion 41 and a target portion 42. Light source portion 41 includes a laser 12 that generates a laser beam 13 along an axis A2 that is perpendicular to optical axis A1. Light source portion 41 also includes a fold mirror FM arranged along optical axis A1 at the intersection of axes A1 and A2, which intersection lies between GIC mirror MG and intermediate focus IF (e.g., between the GIC mirror MG and RCED 110). This allows for a configuration where a multi-shell GIC mirror MG (shown in FIG. 4 has having two GIC mirror shells M1 and M2 by way of example) is arranged along optical axis A1 between LPP 24 and intermediate focus IF. A lens 17 adjacent laser 12 assists in focusing laser beam 13 to a focus F13 at target portion 42 to form LPP 24, as discussed in greater detail below. In an example embodiment, GIC mirror shells M1 and M2 include Ru coatings (not shown) on their respective reflective surfaces.

Target portion 42 is irradiated by laser beam 13 traveling through GIC mirror MG in the –X direction along optical axis A1, thereby creating EUV radiation 30 that is emitted generally in the +X direction. The axial obscuration presented by fold mirror FM is minimal. Thus, laser beam 13 travels in one direction (i.e.; the –X direction) through GIC mirror MG generally along optical axis A1 and EUV radiation 30 travels generally in the opposite direction (i.e., the +X direction) through the GIC mirror MG, RCED 110 and to intermediate focus IF.

LPP Target System

Figure 5A:
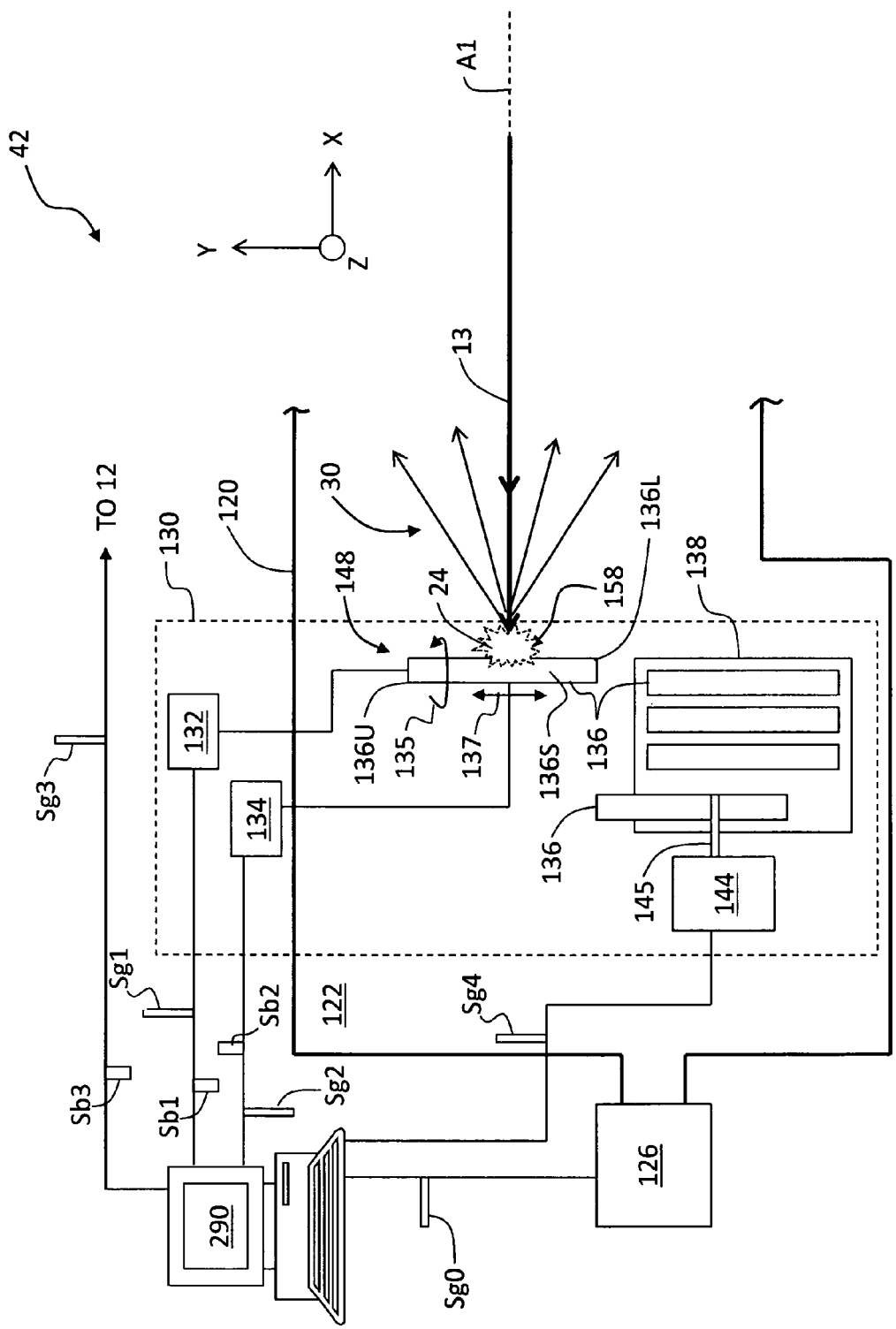
FIG. 5A is a schematic side view of an example target portion of the target system, wherein the target portion includes an example Sn rod system for generating EUV radiation.

FIG. 5A is a schematic side view of an example target portion 42 that includes a Sn rod source for generating EUV radiation 30. Cartesian X-Y-Z coordinates are shown for the sake of reference. Target portion 42 includes a vacuum chamber 120 having a chamber interior 122. A vacuum system 126 is pneumatically coupled to chamber interior 122 and is operable to pull a vacuum therein.

Figure 5B:
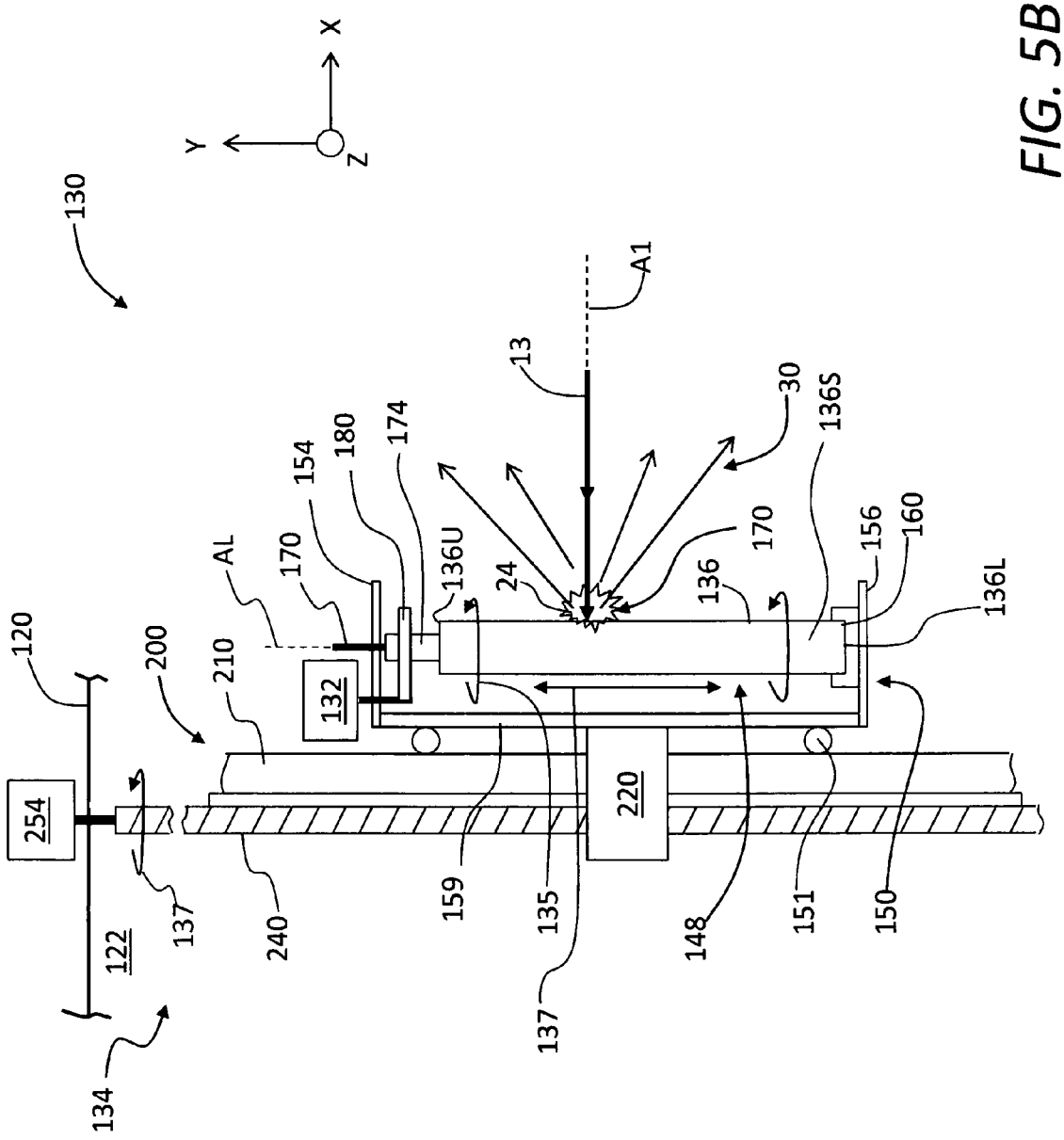
FIG. 5B is a close-up view of a portion of the example Sn rod system of FIG. 5A.

Target portion 42 also includes a Sn rod system 130 disposed within chamber interior 122. FIG. 5B is a close-up view of a portion of an example Sn rod system 130. Sn rod system 130 includes a rotational drive unit 132 and a translational drive unit 134 each mechanically coupled to a Sn rod 136 to respectively cause rotation (arrow 135) around the Y-axis and translation (arrow 137) in the +/−Y directions of the Sn rod 136. Sn rod 136 has a long central axis AL, an upper end 136U, a lower end 136L and an outer surface 136S. Example Sn rods 136 include solid Sn rods, hollow Sn rods, solid rods of one or more materials (e.g., ceramic, glass, etc.) coated with Sn or coated with an adhesion layer on which Sn is then coated, Sn tubes, tubes of one or more materials (e.g., ceramic, glass, etc.) coated with Sn or coated with an adhesion layer on which Sn is then coated, etc.

In an example embodiment, spare Sn rods 136 are stored in a rod storage unit 138 and a robotic handler 144 is used to move the Sn rods 136 from the rod storage unit 138 into its operable position 148 for forming LPP 24, as described below. In an example, spent Sn rods 136 are stored in rod storage unit 138 or in a spent rod storage unit (not shown).

With reference to FIG. 5B, Sn rod system 130 includes a U-shaped support frame 150 that operably supports a Sn rod 136 in operable position 148. Support frame 150 includes an upper arm 154, a lower arm 156 and a vertical member 159 that connects the upper and lower arms 154 and 156. A support base 160 is arranged on lower arm 156 and is configured to rotationally support Sn rod 136 at its lower end 136L. A spindle 170 is rotationally supported at upper arm 154 and is connected to a rotatable support member 174 that rotationally engages Sn rod 136 at upper end 136U. Rotatable support member 174 is mechanically engaged to a rotational drive member 180 (e.g., via a pulley, gear, chain, etc.), which is mechanically connected to rotational drive unit 132.

Sn rod system 130 also includes a vertical rail system 200 to which support frame 150 is mechanically connected and that is configured to translate the support frame 150 generally along the vertical direction (+/−Y axis) (i.e., in the direction of the long central axis AL of the Sn rod 136). In an example embodiment, vertical rail system 200 includes a rail 210 to which support frame 150 is movably attached via a connecting member 220. In one example, support frame 150 includes wheels 151 arranged on vertical member 159 so that the rotatable support member 174 can roll up and down rail 210.

In another example embodiment, vertical member 159 is slidably connected to rail 210 and is moved relative thereto via electromechanical actuators or a stepper motor arrangement. In the example embodiment shown in FIG. 5B, Sn rod system 130 includes a precision lead screw 240 mechanically connected to a linear driver 254 that causes the precision lead screw 240 to rotate when activated. Connecting member 220 is operably connected to the precision lead screw 240 so that the rotation of the precision lead screw 240 causes the vertical translation of support frame 150 and thus Sn rod 136 supported therein.

With reference again to FIG. 5A, target portion 42 includes a controller 290 that is operably connected to vacuum system 126, rotational drive unit 132, translational drive unit 134, robotic handler 144 and laser 12 of light source portion 41 of LPP target system 40 (see FIG. 4). An example controller 290 includes a personal computer that can store instructions (software) in a computer readable medium (memory) to cause the computer (via a processor therein) to carry out the instructions to operate LPP target system 40 to generate LPP 24.

With continuing reference to FIG. 5A and also to FIG. 5B, in the operation of target portion 42, controller 290 sends a signal Sg0 to vacuum system 126, which causes the vacuum system 126 to pull a vacuum in interior 122 of vacuum chamber 120. Here it is assumed that vacuum chamber 120 is connected to or is part of a larger vacuum chamber (not shown) that houses LPP-GIC SOCOMO 100. Controller 290 also sends a signal Sg1 to rotational drive unit 132 to initiate the rotation of Sn rod 136, and a signal Sg2 to translational drive unit 134 to cause the vertical translation of the Sn rod 136.

Controller 290 also sends a signal Sg3 to laser 12 in light source portion 41 (FIG. 4) to initiate the formation of laser beam 13, which comprises a train of optical pulses. Laser beam 13 irradiates a portion of surface 136S of rotating Sn rod 136 at an irradiation location 158, thereby forming LPP 24, which emits EUV radiation 30 generally in the +X direction.

The coordinated rotation and translation of Sn rod 136 provides a new (fresh) portion of the outer surface 136S of Sn rod 136 at irradiation location 158 for each optical pulse in laser beam 13, which allows for high repetition rates and long run times for LPP 24. In an example embodiment, Sn rod 136 is rotated at a rotational speed such that each laser pulse in laser beam 13 is incident upon a fresh Sn surface. In an example embodiment, Sn rod 136 is rotated and translated in a manner that gives it a spiral motion so that the exposed portions of the outer surface 136S of Sn rod 136 form a spiral pattern on the outer surface 136S of Sn rod 136. This spiral motion allows for the vertical translation part of the Sn rod motion to be smooth rather than stop-and-start.

In an example where laser beam 13 forms a laser spot having a 25 micron (0.001 inch) diameter, a 1 inch diameter Sn rod 136 would present 3,140 irradiation sites per rotation. Where laser 12 operates at 1 Khz, one rotation would take 3.14 seconds, or about 19 rpm. A linear translation of 0.001 inch per rotation presents a clean target spot for each laser pulse. A translation of 0.001 inches in 3.14 seconds yields 52.3 minutes per inch. Thus, a 12 inch long Sn rod 136 would last about 10.5 hours.

Once a Sn rod 136 has been irradiated over most or all of its outer surface 136S, it is spent and needs to be replaced with a new Sn rod 136. In this instance, controller 290 receives feedback signals Sb1 and Sb2 from rotational drive unit 132 and translational drive unit 134, respectively, that provide information regarding the number of rotations and the amount of translation of the Sn rod 136. Controller 290 also receives a feedback signal Sb3 from laser 12 that indicates the pulse repetition rate of the laser 12. Based on the information in these feedback signals Sb1, Sb2 and Sb3, controller 290 calculates when a given Sn rod 136 is spent and needs to be removed and replaced with a new Sn rod 136. Alternatively, the final position of Sn rod 136 relative to irradiation location 158 is used to deter'mine when Sn rod 136 is spent.

When a new Sn rod 136 is needed, controller 290 sends a control signals Sg4 to robotic handler 144, which in response thereto removes the spent Sn rod 136 from operable position 148 and places it back in rod storage unit 138 or in a used rod storage unit (not shown). Robotic handler 144 then obtains a new Sn rod 136 from rod storage unit 138 and places it support frame 150 so that the Sn rod 136 is in the operable position 148. The process for forming LPP 24 is then repeated with the fresh Sn rod 136.

SOCOMO with No First-Mirror Multilayer

An example configuration of LPP-GIC SOCOMO 100 has no multilayer-coated "first mirror," i.e., the mirror or mirror section upon which EUV radiation 30 is first incident (i.e., first reflected) does not have a multilayer coating 18. In another example configuration of LPP-GIC SOCOMO 100, the first mirror is substantially a grazing incidence mirror. In other embodiments, the first mirror may include a multilayer coating 18.

Figure 6:
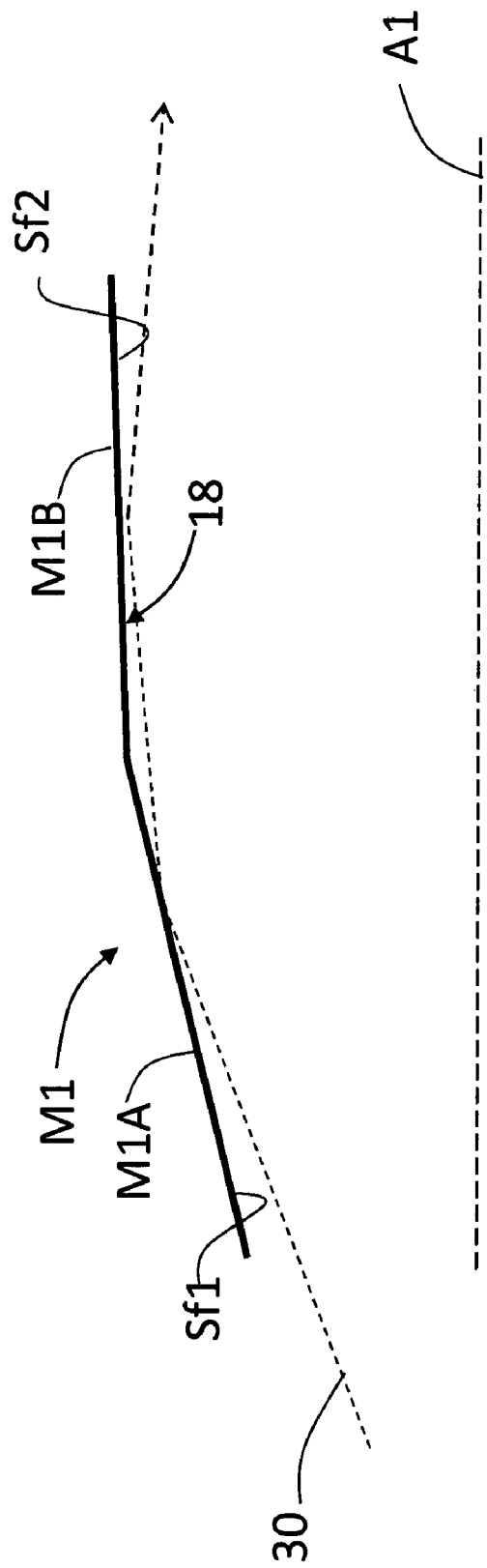
FIG. 6 is a cross-sectional diagram of an example GIC mirror having two sections with respective first and second surfaces that provide first and second reflections of EUV radiation.

A major advantage of LPP-GIC SOCOMO 100 is that its performance is not dependent upon on the survival of a multilayer coated reflective surface. Example embodiments of GIC mirror MG have at least one segmented GIC mirror shell, such as GIC mirror shell M1 shown in FIG. 6. GIC mirror shell M1 is shown as having a two mirror segments M1A and M1B with respective first and second surfaces Sf1 and Sf2. First surface Sf1 provides the first reflection (and is thus the "first mirror") and second surface Sf2 provides a second reflection that is not in the line of sight to LPP 24. In an example embodiment, second surface Sf2 supports a multilayer coating 18 since the intensity of the once-reflected EUV radiation 30 is substantially diminished and is not normally in the line of sight of LPP 24, thus minimizing the amount of ions and neutral atoms incident upon the multilayer coating 18.

GIC vs. NIC SOCOMOs

There are certain trade-offs associated with using a LPP-GIC SOCOMO 100 versus a LPP-NIC SOCOMO 10. For example, for a given collection angle of the EUV radiation 30 from the LPP 24, the LPP-NIC SOCOMO 10 can be designed to be more compact than the LPP-GIC SOCOMO 100.

Also, the LPP-NIC SOCOMO 10 can in principle be designed to collect EUV radiation 30 emitted from the source at angles larger than 90° (with respect to the optical axis A1), thus allowing larger collection efficiency. However, in practice this advantage is not normally used because it leads to excessive NIC diameters or excessive angles that the EUV radiation 30 forms with the optical axis A1 at intermediate focus IF.

Also, the far field intensity distribution generated by a LPP-GIC SOCOMO 100 has additional obscurations due to the shadow of the thickness of the GIC mirror shells M1 and M2 and of the mechanical structure supporting the GIC mirrors MG. However, the present disclosure discusses embodiments below where the GIC surface includes a surface correction that mitigates the shadowing effect of the GIC mirror shells thicknesses and improves the uniformity of the focal spot FS at the intermediate focus IF.

Further, the focal spot FS at intermediate focus IF will in general be larger for a LPP-GIC SOCOMO 100 than for a LPP-NIC SOCOMO 10. This size difference is primarily associated with GIC mirror figure errors, which are likely to decrease as the technology evolves.

On the whole, it is generally believed that the above-mentioned trade-offs are far outweighed by the benefits of a longer operating lifetime, reduced cost, simplicity, and reduced maintenance costs and issues associated with a LPP-GIC SOCOMO 100.

Example GIC Mirror for LPP-GIC SOCOMO

Figure 7:
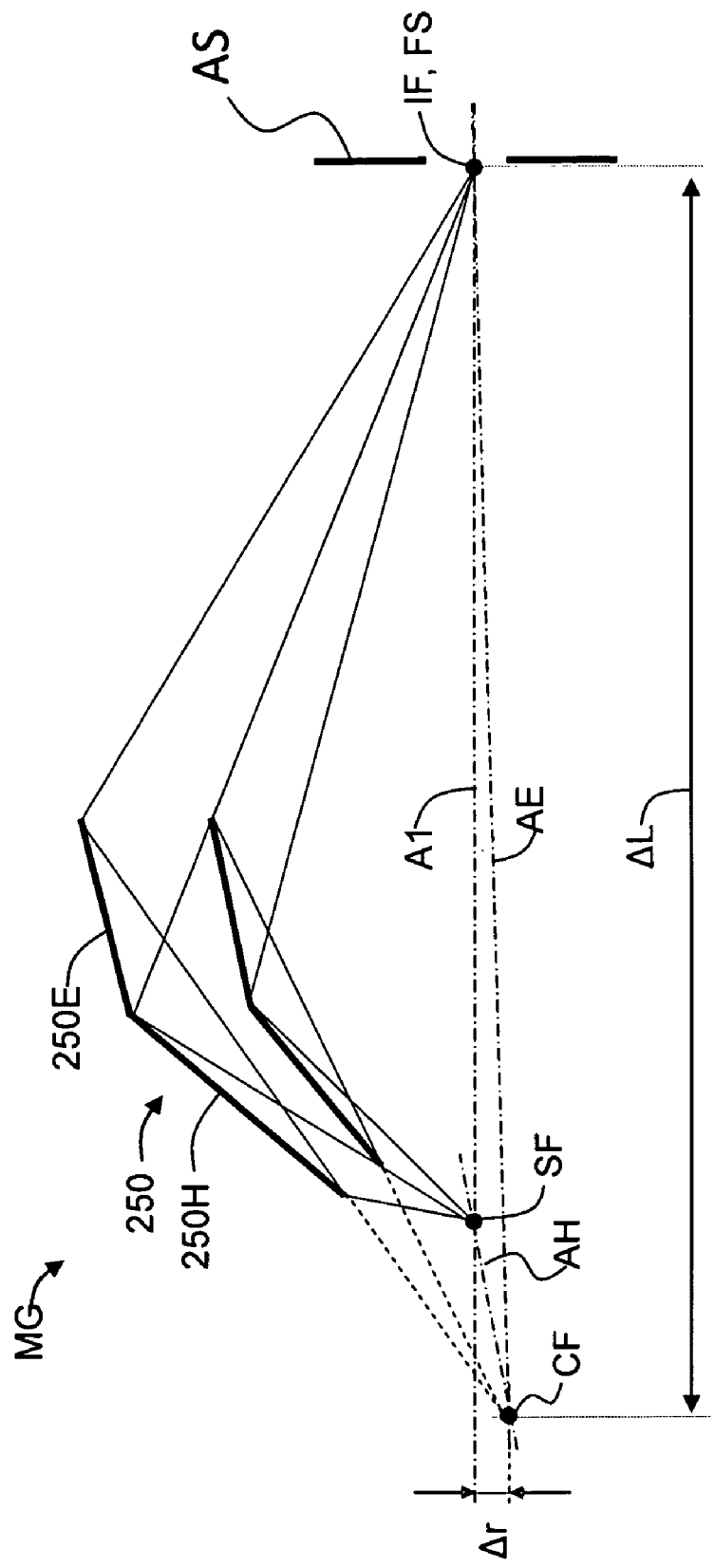
FIG. 7 is a schematic cross-sectional diagram of a portion of an example GIC mirror showing two of the two-section GIC mirror shells used in the outer portion of the GIC mirror.
Figure 8:
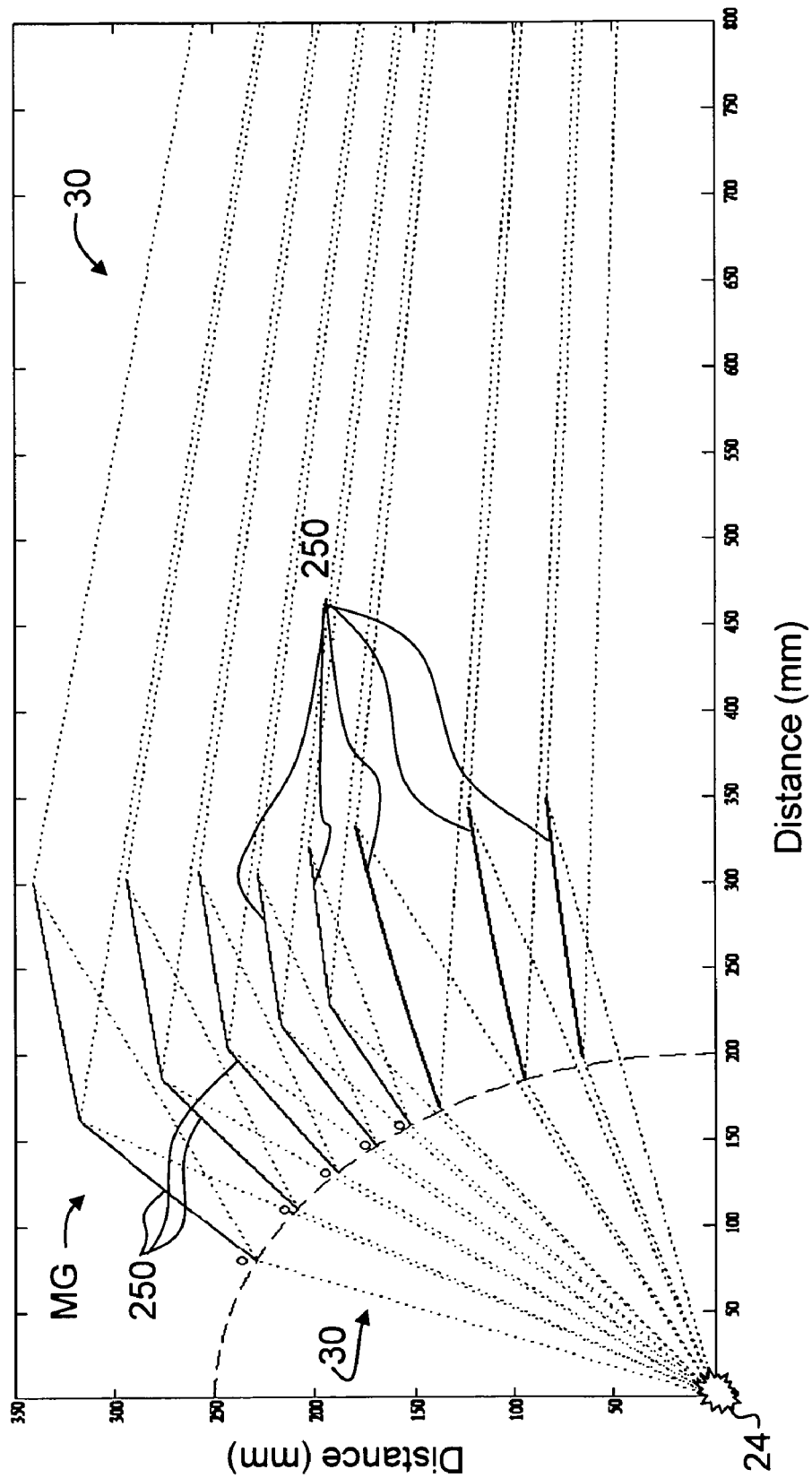
FIG. 8 is a schematic cross-sectional diagram of a portion of the GIC mirror of FIG. 7 showing by way of example eight GIC mirror shells and the LPP.

FIG. 7 is a schematic side view of a portion of an example GIC mirror MG for use in LPP-GIC SOCOMO 100. By way of example, the optical design of GIC mirror MG of FIG. 7 actually consists of eight nested GIC mirror shells 250 with cylindrical symmetry around the optical axis A1, as shown in FIG. 8. To minimize the number of GIC mirror shells 250, in the present example the first three innermost GIC mirror shells 250 are elliptical, whereas the five outermost GIC mirror shells 250 are based on an off-axis double-reflection design having elliptical and hyperbolic cross sections, such as described in European Patent Application Publication No. EP1901126A1, entitled "A collector optical system," which application is incorporated by reference herein. FIG. 7 shows two of the outermost GIC mirror shells 250 having an elliptical section 250E and a hyperboloidal section 250H. FIG. 7 also shows the source focus SF, the virtual common focus CF, and the intermediate focus IF, as well as the axes AE and AH for the elliptical and hyperboloidal sections 250E and 250H of GIC mirror shells 250, respectively. The distance between virtual common focus CF and intermediate focus IF is $\Delta L$. The virtual common focus CF is offset from the optical axis A1 by a distance $\Delta r$. The full optical surface is obtained by a revolution of the sections 250E and 250H around the optical axis A1.

Example designs for the example GIC mirror MG are provided in Table 1 and Table 2 below. The main optical parameters of the design are: a) a distance $\Delta L$ between LPP 24 and intermediate focus IF of 2400 mm; and b) a maximum collection angle at the LPP side of 70.7°. In an example embodiment, GIC mirror shells 250 each include a Ru coating for improved reflectivity at EUV wavelengths. The nominal collection efficiency of the GIC mirror MG for EUV radiation 30 of wavelength of 13.5 nm when the optical surfaces of GIC mirror shells 250 are coated with Ru is 37.6% with respect to $2\pi$ steradians emission from LPP 24.

Since an LPP EUV source is much smaller than a discharge-produced plasma (DPP) EUV source (typically by a factor of 10 in area), the use of LPP 24 allows for better etendue matching between the output of GIC mirror MG and the input of illuminator. In particular, the collection angle at LPP 24 can be increased to very large values with negligible or very limited efficiency loss due to mismatch between the GIC mirror MG and illuminator etendue. In an example embodiment, the collection half-angle can approach or exceed 70°.

The dimension of LPP 24 has a drawback in that the uniformity of the intensity distribution in the far field tend to be worse than for a DPP source, for a given collector optical design. Indeed, since the LPP 24 is smaller, the far-field shadows due to the thicknesses of GIC mirror shells 250 tend to be sharper for an LPP source than for a DPP source.

To compensate at least partially for this effect, a surface figure (i.e., optical profile) correction is added to each GIC mirror shell 250 to improve the uniformity of the intensity distribution in the far field (see, e.g., Publication No. WO2009-095219 A1, entitled "Improved grazing incidence collector optical systems for EUV and X-ray applications," which publication is incorporated by reference herein). Thus, in an example embodiment of GIC mirror MG, each GIC mirror shell 250 has superimposed thereon a polynomial (parabolic) correction equal to zero at the two edges of the GIC mirror shells 250 and having a maximum value of 0.01 mm.

Figure 10:
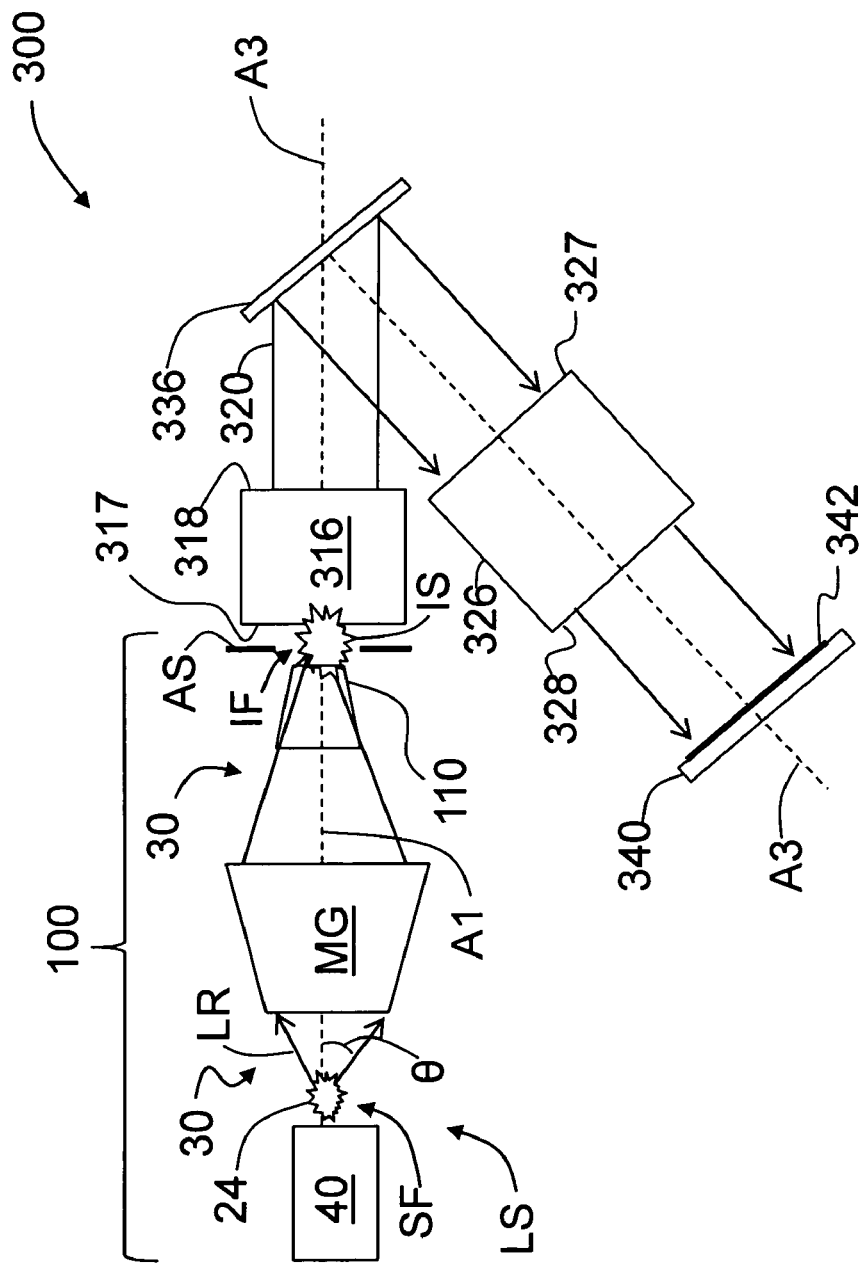
FIG. 10 is a schematic diagram of an EUV lithography system that utilizes the LPP-GIC SOCOMO of the present disclosure.

Table 1 and Table 2 set forth an example design for the GIC mirror MG shown in FIG. 10. The "mirror #" is the number of the particular GIC mirror shell 250 as numbered starting from the innermost GIC mirror shell 250 to the outermost GIC mirror shell 250.

TABLE 1

| | Hyperbola | | Ellipse | | Mirror radii [mm] | | |
|---|---|---|---|---|---|---|---|
| Mirror # | Conic Constant | Radius of curvature [mm] | Conic Constant | Radius of curvature [mm] | Maximum | Ellipse-hyperbola joint | Minimum |
| 1 | — | — | −0.990478 | 11.481350 | 83.347856 | — | 65.369292 |
| 2 | — | — | −0.979648 | 24.674461 | 122.379422 | — | 94.644337 |
| 3 | — | — | −0.957302 | 52.367323 | 179.304368 | — | 137.387744 |
| 4 | −1.066792 | 29.401382 | −0.963621 | 61.100890 | 202.496522 | 192.634298 | 152.384167 |
| 5 | −1.072492 | 34.268782 | −0.949865 | 86.379783 | 228.263879 | 216.839614 | 169.639161 |
| 6 | −1.090556 | 46.865545 | −0.941216 | 104.704248 | 257.297034 | 243.541412 | 188.559378 |
| 7 | −1.111163 | 61.694607 | −0.926716 | 134.626393 | 293.432077 | 276.198514 | 208.671768 |
| 8 | −1.134540 | 81.393448 | −0.905453 | 180.891785 | 340.258110 | 317.294990 | 229.102808 |

TABLE 2

| | Position of virtual common focus CF with respect to intermediate focus IF | |
|---|---|---|
| Mirror # | ΔL, parallel to optical axis A1 [mm] | Δr, transverse to optical axis A1 [mm] |
| 1 | — | — |
| 2 | — | — |
| 3 | — | — |
| 4 | 3293.000000 | 171.500000 |
| 5 | 3350.000000 | 237.000000 |
| 6 | 3445.000000 | 276.300000 |
| 7 | 3521.000000 | 335.250000 |
| 8 | 3616.000000 | 426.950000 |

Figure 9B:
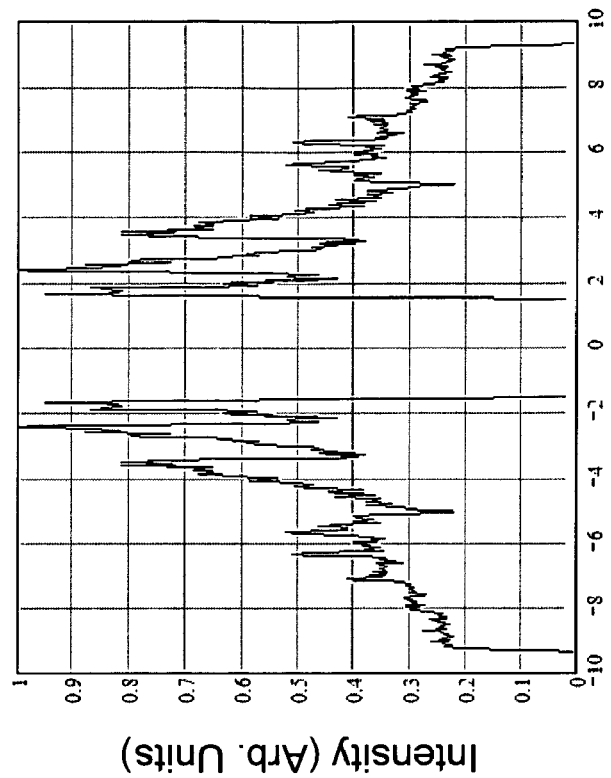
FIG. 9B is the same plot as FIG. 9A but with a polynomial surface-figure correction that improves the far-field image uniformity.
Figure 9A:
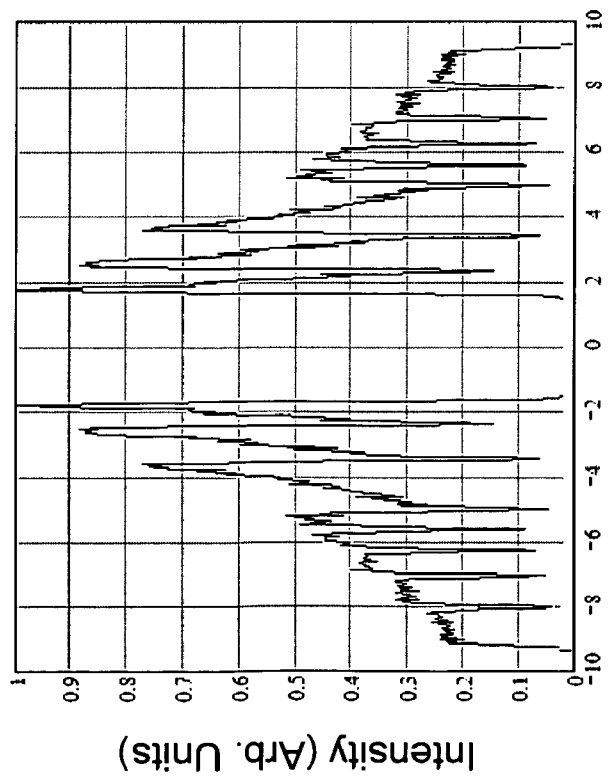
FIG. 9A is a plot of the normalized far-field position vs. Intensity (arbitrary units) for the case where the GIC mirror shells do not include a polynomial surface-figure correction to improve the far-field image uniformity.

FIG. 9A is a plot of the normalized far-field position at the intermediate focus IF vs. intensity (arbitrary units) for light rays incident thereon for the case where there is no correction of the GIC mirror shell profile. The plot is a measure of the uniformity of the intermediate image (i.e., "focal spot" FS) of LPP 24 as formed at the intermediate focus IF. LPP 24 is modeled as a sphere with a 0.2 mm diameter.

FIG. 9B is the same plot except with the above-described correction added to GIC mirror shells 250. The comparison of the two plots of FIG. 9A and FIG. 9B shows substantially reduced oscillations in intensity in FIG. 9B and thus a significant improvement in the far field uniformity the focal spot FS at the intermediate focus IF as a result of the corrected surface figures for the GIC mirror shells 250.

EUV Lithography System with LPP-GIC SOCOMO

FIG. 10 is an example EUV lithography system ("lithography system") 300 according to the present disclosure. Example lithography systems 300 are disclosed, for example, in U.S. Patent Applications No. US2004/0265712A1, US2005/0016679A1 and US2005/0155624A1, which are incorporated herein by reference.

Lithography system 300 includes a system axis A3 and an EUV light source LS that includes LPP-GIC SOCOMO 100 with optical axis A1 and having the tin-rod-based LPP target system 40 as described above, which generates LPP 24 that emits working EUV radiation 30 at $\lambda=13.5$ nm.

LPP-GIC SOCOMO 100 includes GIC mirror MG and optional RCED 110 as described above. In an example embodiment, GIC mirror MG is cooled as described in U.S. patent application Ser. No. 12/592,735, which is incorporated by reference herein. Also in an example, RCED 110 is cooled.

GIC mirror MG is arranged adjacent and downstream of EUV light source LS, with optical (collector) axis A1 lying along system axis A3. GIC mirror MG collects working EUV radiation 30 (i.e., light rays LR) from EUV light source LS located at source focus SF and the collected radiation forms source image IS (i.e., a focal spot) at intermediate focus IF. RCED 110 serves to enhance the collection of EUV radiation 30 by funneling to intermediate focus IF the EUV radiation 30 that would not otherwise make it to the intermediate focus IF. In an example, LPP-GIC SOCOMO 100 comprises LPP target system 40, GIC mirror MG and RCED 110.

An embodiment of RCED 110 as discussed above in connection with FIG. 3B includes at least one funnel element 111. In one example, funnel element 111 is a downstream funnel element 111D configured to direct EUV radiation 30 from focal spot FS at intermediate focus IF to a downstream location, such as the illumination optics (illuminator) downstream of the intermediate focus IF. In another example, funnel element 111 is an upstream funnel element 111U that directs EUV radiation 30 to form focal spot FS at intermediate focus IF, including collecting radiation that would not otherwise participate in forming the focal spot FS. In an example, RCED 110 includes both upstream and downstream funnel elements 111U and 111D. RCED 110 serves to make the projected radiation at the illuminator more uniform and thereby better utilized at the reticle plane.

An illumination system 316 with an input end 317 and an output end 318 is arranged along system axis A3 and adjacent and downstream of GIC mirror MG with the input end adjacent the GIC mirror MG. Illumination system 316 receives at input end 317 EUV radiation 30 from source image IS and outputs at output end 318 a substantially uniform EUV radiation beam 320 (i.e., condensed EUV radiation). Where lithography system 300 is a scanning type system, EUV radiation beam 320 is typically formed as a substantially uniform line (e.g., ring field) of EUV radiation 30 at reflective reticle 336 that scans over the reflective reticle 336.

A projection optical system 326 is arranged along (folded) system axis A3 downstream of illumination system 316 and downstream of the illuminated reflective reticle 336. Projection optical system 326 has an input end 327 facing output end 318 of illumination system 316, and an opposite output end 328. A reflective reticle 336 is arranged adjacent the input end 327 of projection optical system 326 and a semiconductor wafer 340 is arranged adjacent the output end 328 of projection optical system 326. Reflective reticle 336 includes a pattern (not shown) to be transferred to semiconductor wafer 340, which includes a photosensitive coating (e.g., photoresist layer) 342. In operation, the uniformized EUV radiation beam 320 irradiates reflective reticle 336 and reflects therefrom, and the pattern thereon is imaged onto photosensitive coating 342 of semiconductor wafer 340 by projection optical system 326. In a scanning type lithography system 300, the reflective reticle image scans over the photosensitive coating 342 to form the pattern over the exposure field. Scanning is typically achieved by moving reflective reticle 336 and semiconductor wafer 340 in synchrony.

Once the reticle pattern is imaged and recorded on semiconductor wafer 340, the patterned semiconductor wafer 340 is then processed using standard photolithographic and semiconductor processing techniques to form integrated circuit (IC) chips.

Note that in general the components of lithography system 300 are shown lying along a common folded system axis A3 in FIG. 10 for the sake of illustration. One skilled in the art will understand that there is often an offset between entrance and exit axes for the various components such as for illumination system 316 and for projection optical system 326.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A source-collector module for an extreme ultraviolet (EUV) lithography system, comprising:
   a laser that generates a pulsed laser beam;
   a fold mirror arranged along a source-collector module axis and configured to receive the pulsed laser beam and reflect the pulsed laser beam down the source-collector module axis in a first direction;
   a Sn rod system having a Sn rod with a Sn surface and configured to rotate the Sn surface past an irradiation location where the Sn surface is irradiated by the pulsed laser beam, thereby creating a laser-produced plasma (LPP) that generates EUV radiation in a second direction that is generally opposite the first direction; and
   a grazing-incidence collector (GIC) mirror having an input end and an output end and arranged to receive the EUV radiation at the input end and focus the received EUV radiation at an intermediate focus adjacent the output end.

2. The source-collector module of claim 1, wherein the Sn rod is selected from the group of Sn rods comprising: a solid Sn rod, a hollow Sn rod, a solid rod made of one or more materials coated with Sn, a Sn tube, a tube of one or more materials coated with Sn, and a tube coated with an adhesion layer on which Sn is then coated.

3. The source-collector module of claim 1, wherein the Sn rod is both rotatable around and linearly translatable along the central axis.

4. The source-collector module of claim 3, further comprising:
   a support frame that rotationally and translationally supports the Sn rod in an operable position; and
   a rotational drive unit mechanically configured to rotate the Sn rod within the support frame via a mechanical drive member.

5. The source-collector module of claim 4, further comprising:
   a translational drive unit mechanically configured to translate the support frame so as to translate the Sn rod along its central axis.

6. The source-collector module of claim 5, wherein the translational drive unit includes a rail to which the support frame is movably attached via a connecting member, and further includes a precision lead screw and a linear drive that causes rotation of the lead screw that in turn causes translation of the connecting member and thus the support frame containing the Sn rod.

7. The source-collector module of claim 5, wherein the translational drive unit includes a rail to which the support frame is movably attached via a connecting member, and further includes at least one of an electromechanical actuator and stepper motor operably connected to the connecting member and configured to effectuate translation of the support frame and the Sn rod contained therein.

8. The source-collector module of claim 5, further comprising:
   a rod storage unit configured to store one or more Sn rods.

9. The source-collector module of claim 8, further comprising:
   a robotic handler configured to remove spent Sn rods from the support frame and store the spent rods in the rod storage unit, and to remove unspent rods from the rod storage unit and place the unspent rods in the operable position in the support frame.

10. A laser produced plasma (LPP) target system, comprising:
    a laser that generates a pulsed laser beam comprising a train of optical pulses;
    a Sn rod that includes an Sn surface and a central axis;
    a support frame that supports the Sn rod in an operable position so that the Sn rod can both rotate and translate about its central axis; and
    a rotational drive unit and a translational drive unit respectively mechanically coupled to the Sn rod to cause the Sn rod to rotate and translate about its central axis so that a new portion of the Sn surface is irradiated by each optical pulse in the pulsed laser beam.

11. The LPP target system of claim 10, further comprising:
    a rod storage unit configured to store one or more Sn rods; and
    a robotic handler configured to remove Sn rods from the support frame and store the removed Sn rods in the rod storage unit, and to remove new Sn rods from the rod storage unit and place the new Sn rods in the operable position in the support frame.

* * * * *